(12) United States Patent
Heitzmann

(10) Patent No.: US 9,529,127 B2
(45) Date of Patent: Dec. 27, 2016

(54) METHOD FOR PRODUCING A REFRACTIVE OR DIFFRACTIVE OPTICAL DEVICE

(71) Applicant: COMMISSARIAT A L'ENERGIE ATOMIQUE ET AUX ENE ALT, Paris (FR)

(72) Inventor: Michel Heitzmann, Crolles (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 216 days.

(21) Appl. No.: 14/352,426

(22) PCT Filed: Oct. 17, 2012

(86) PCT No.: PCT/EP2012/070593
§ 371 (c)(1),
(2) Date: Apr. 17, 2014

(87) PCT Pub. No.: WO2013/057152
PCT Pub. Date: Apr. 25, 2013

(65) Prior Publication Data
US 2014/0285891 A1    Sep. 25, 2014

(30) Foreign Application Priority Data

Oct. 18, 2011    (FR) .................. 11 59382

(51) Int. Cl.
*G03F 7/20*    (2006.01)
*G02B 5/18*    (2006.01)
(Continued)

(52) U.S. Cl.
CPC ....... *G02B 5/1857* (2013.01); *B29D 11/00769* (2013.01); *G02B 3/08* (2013.01);
(Continued)

(58) Field of Classification Search
CPC ....... G02B 5/1857; G02B 5/1876; G02B 3/08; G02B 2003/0093; G03F 7/0005; G03F 7/0035; G03F 7/2002
(Continued)

(56) References Cited

U.S. PATENT DOCUMENTS 5,672,450 A    9/1997 Rolfson
6,120,950 A    9/2000 Unno
(Continued)

FOREIGN PATENT DOCUMENTS

EP    0 834 751    4/1998

OTHER PUBLICATIONS

International Search Report Issued Jan. 23, 2013 in PCT/EP12/070593 Filed Oct. 17, 2012.
(Continued)

*Primary Examiner* — John A McPherson
(74) *Attorney, Agent, or Firm* — Oblon, McClelland, Maier & Neustadt, L.L.P.

(57) ABSTRACT

A method producing a refractive or diffractive optical device, including: production, in a first layer, of at least one inclined general profile approximated by a staircase profile including plural stairsteps; production of the profile including: forming buffer patterns on the first layer and at least one sequence including: forming masking patterns, so each masking pattern includes at least one edge situated above a buffer pattern and covers at least one area of the first layer not masked by the buffer patterns, the forming the masking patterns also defining, for the first layer, plural free areas not masked by the masking patterns or by the buffer patterns; etching the free areas to form trenches in the first layer. The production of the profile also includes: removing the masking patterns, removing the buffer patterns revealing walls (Continued)

previously covered by the buffer patterns, and then an isotropic etching to remove the walls.

20 Claims, 7 Drawing Sheets

(51) Int. Cl.
 G03F 7/00 (2006.01)
 B29D 11/00 (2006.01)
 G02B 3/08 (2006.01)
 G02B 3/00 (2006.01)
(52) U.S. Cl.
 CPC ......... *G02B 5/1876* (2013.01); *G03F 7/0005* (2013.01); *G03F 7/0035* (2013.01); *G03F 7/2002* (2013.01); *G02B 2003/0093* (2013.01)
(58) Field of Classification Search
 USPC ...... 430/321, 323; 216/24, 26; 359/571, 741
 See application file for complete search history.

(56) References Cited

U.S. PATENT DOCUMENTS

| 6,301,001 | B1 | 10/2001 | Unno |
| 6,475,704 | B1 | 11/2002 | Iwasaki et al. |
| 6,562,253 | B1* | 5/2003 | Ogusu .................. B29D 11/00 216/12 |
| 2001/0026399 | A1 | 10/2001 | Nakabayashi et al. |
| 2002/0042024 | A1 | 4/2002 | Tanaka et al. |
| 2003/0008245 | A1 | 1/2003 | Iwasaki et al. |
| 2005/0237614 | A1 | 10/2005 | Nakabayashi et al. |
| 2009/0087794 | A1 | 4/2009 | Sekikawa et al. |

OTHER PUBLICATIONS

International Preliminary Report on Patentability Issued Jan. 30, 2014 in PCT/EP12/070593 Filed Oct. 17, 2012.
Daeschner, W. et al. "Cost-effective mass fabrication of multilevel diffractive optical elements by use of a single optical exposure with a gray-scale mask on high-energy beam-sensitive glass" Applied optics, vol. 36, No. 20, pp. 4675-4680, Jul. 10, 1997.
Morgan, B. et al. "Development of a Deep Silicon Phase Fresnel Lens Using Gray-Scale Lithography and Deep Reactive Ion Etching" IEEE, Journal of Microelectromechanical Systems, vol. 13, No. 1, pp. 113-120, Feb. 2004.
Reimer, K. et al. "Micro-optic fabrication using one-level gray-tone lithography" Proc. SPIE, vol. 3008, pp. 279-288, Miniaturized Systems with Microoptics and Micromechanics II, 1997.

* cited by examiner

PRIOR ART

PRIOR ART

PRIOR ART

METHOD FOR PRODUCING A REFRACTIVE OR DIFFRACTIVE OPTICAL DEVICE

TECHNICAL FIELD OF THE INVENTION

The present invention concerns the production, by lithography and etching, of an inclined general profile. It receives for an advantageous application a method for producing, by lithography and etching, an optical device in general and more particularly a method for producing a refractive or diffractive optical device.

PRIOR ART

Many technology pieces require the production of inclined structures of millimetric, micrometric or even nanometric sizes. These inclined structures are in particular necessary for producing refractive or diffractive optical devices. In a known manner, these devices exploit the phenomena of refraction or diffraction of light.

Small optical devices are often integrated in micro-opto-electro-mechanical systems (MOEMs), such as for example optical switches, optical connectors or micro-mirror matrices. They can be integrated in numerous other applications such as light guides and, more generally, refractive or diffractive lenses.

These devices are based on a multitude of inclined profiles forming a general structure generally in a sawtooth or herringbone pattern. The quality of the profile is important, in particular because it determines the performance of the optical device.

Normally, refractive or diffractive optical devices are obtained by etching lines on the surface of a substrate such as a reflective mirror, for example made from glass, or such as a silicon substrate. The etching can be done by means of a diamond or by having recourse to reactive plasma etching for finer structures.

In the latter case, two approaches are generally used.

A first known approach consists of disposing a resist on a substrate to be etched and insolating the resist so that it has the required sawtooth or herringbone profile after development thereof. The substrate is then etched using a method that etches the resist and substrate at the same speed. The required profile is then transferred into the substrate. This approach is, for example, described in the publication entitled "Cost-effective mass fabrication of multilevel diffractive optical elements by use of a single optical exposure with a gray-scale mask on high-energy beam-sensitive glass", Daschner, Long, Stein, Wu and Lee, which appeared in APPLIED OPTICS Vol. 36 No. 20, 10 Jul. 1997.

For this first approach, a grey-scale mask is used, which requires that a grey level be optimised for each pattern by means optionally of several iterations. This is a drawback, especially if the number of components to be produced is small and the manufacturing times short.

Another approach consists of approximating the required inclined profile by means of a staircase profile. Successive lithography and etching steps are performed in order to create the trenches of a variable depth and width so as to form the stairsteps of the staircase. Because of the small etching depths required, three lithography steps and three etching steps are sufficient in general to obtain a good approximation of the ideal profile. These lithography and etching steps are standard steps easily adaptable to each pattern.

The drawback of this approach lies in the alignment tolerances of one lithography step compared with the previous one. This is because a defect in alignment between two successive lithography steps causes undesired parasitic peaks or hollows which degrade the performances of the device.

FIGS. 1, 2, 3, 4a and 5a illustrate the theoretical steps of a method according to the second approach during which the alignment is perfect.

As shown in FIG. 1, resist patterns 2a are formed on a substrate 1, these patterns 2a thus defining masked areas 3a. The substrate 1 is next etched (FIG. 2) at the areas not masked by the resist 2a. The resist is next removed (FIG. 3). As illustrated in FIG. 4, a new deposit of resist is effected so as to form patterns 2b on the areas 4a not etched previously and on areas 5a etched previously. The width $L_2$ of the patterns 2b formed second is half of the width L of the patterns 2a formed first. The widths L and $L_2$ are illustrated in FIGS. 2 and 5a respectively. Next a new step of etching the substrate is performed at the areas not masked by the patterns 2b. In this way, trenches with different depths are obtained (see FIG. 5a). It then suffices to remove the resist patterns 2b in order to obtain a staircase profile.

In practice, it is relatively complicated to perform steps 4a and 5a described previously. This is because these steps require the patterns to be produced second to be positioned very precisely with respect to the trenches already produced.

FIGS. 4b, 5b on the one hand and 4c, 5c on the other hand illustrate clearly the consequences of a defect in alignment of the various lithography steps. These steps follow the steps described with reference to FIGS. 1 to 3.

As illustrated in FIG. 4b, if the resist patterns 2b have an offset d1 to the right compared with their theoretical position illustrated in FIG. 4a, then a hollow 5 forms during the following etching. This hollow 5 appears clearly in FIG. 5b and remains after removal of the resist patterns 2b.

As illustrated in FIG. 4c, if the resist patterns 2b have an offset d2 to the left compared with their theoretical position illustrated in FIG. 4a, then a peak 6 forms during the following etching. This peak 6 appears clearly in FIG. 5c and remains after removal of the resist patterns 2b.

This second approach therefore causes a risk of creating parasitic peaks or hollows derived from the superimposition of resist masks during the successive lithography steps. The profile obtained is therefore different from the required profile, which requires corrective steps or causes a degradation of the performances of the device produced.

The objective of the present invention is to propose a solution for obtaining an inclined profile while reducing the risk of formation of peaks and hollows.

SUMMARY OF THE INVENTION

The subject matter of the present invention is a method comprising the production, in a first layer, of at least one inclined general profile approximated by a staircase profile having a plurality of steps; the production of the profile comprising the following steps: a step of forming buffer patterns on the first layer so as to define on the first layer a buffer mask and at least one sequence of steps comprising:
  a step of forming masking patterns, performed so that each masking pattern has at least one edge situated above a buffer pattern and covers at least one area of the first layer not masked by the buffer patterns and performed so as to define, for the first layer, a plurality of free areas not masked by the masking patterns or by the buffer patterns;

a step of etching the free areas in order to form trenches in the first layer.

Preferably, the production of the profile also comprises: a step of removing the masking patterns, a step of removing the buffer patterns revealing the walls previously covered by the buffer patterns, and then an etching step, preferably isotropic, in order to remove the walls.

Thus the edge of a buffer pattern delimits at least one wall of a trench. Each masking pattern, on at least one of the edges thereof, does not delimit one of the walls of the trench formed during the etching of the first layer. The etching patterns therefore do not need to be perfectly aligned with regard to at least one of their edges as long as this edge is situated above the buffer pattern. The invention thus makes it possible to eliminate or at least reduce the consequences of defects in alignment of the masking patterns with respect to the other layers in the stack. In this way, the formation of undesired hollows or protrusions is avoided.

The advantages of the invention are all the more manifest since the method comprises a plurality of sequences each comprising the formation of masking patterns followed by an etching of the first layer.

The buffer patterns therefore serve as a buffer absorbing or eliminating the defects in alignment of the masking patterns.

The present invention therefore makes it possible to obtain more precise profiles while reducing the constraints in positioning of the masking patterns.

The positioning constraints being reduced, the invention further makes it possible to reduce the cost of the equipment necessary and the cost of obtaining the inclined profiles.

Optionally, the method according to the invention may have at least any one of the optional steps and features stated below.

According to an advantageous embodiment, the method for producing the inclined general profile is implemented in order to produce a refractive or diffractive optical device.

In a particularly advantageous manner, at least some of the masking patterns have two respective edges situated above a buffer pattern.

Thus the two walls of the trenches are delimited by the edges of the buffer patterns. Consequently, whatever their positioning and as long as their edges are situated above a buffer pattern, the masking patterns do not define the walls of the trench. A defect in their alignment therefore has no consequence on the patterns formed in the first layer.

Advantageously, at the end of the etching step, the masking patterns are removed and the buffer patterns are left in place. This previous step of removing the masking patterns is performed at the end of the etching step of each sequence.

Preferably, the method comprises at least two sequences.

Preferably, the method comprises at least one sequence in which at least one masking pattern covers at least one trench previously formed in the first layer.

Preferentially, the method comprises at least one sequence in which at least one masking pattern covers at least one trench previously formed in the first layer and at least one free area.

Preferably, the method comprises at least one sequence in which at least one masking pattern covers several trenches previously formed in the first layer, said trenches having different depths.

Preferentially, the buffer patterns are disposed directly on the first layer. Alternatively, at least one intermediate layer is present between the buffer patterns on the first layer, this at least one intermediate layer being able to be etched during etching steps in order to form trenches.

Advantageously, during the masking step, at least one masking pattern covers at least one area not masked by a buffer pattern, the number of areas not masked by a buffer pattern and covered by the same masking pattern being equal to $2^n$, where n is the number of etching steps previously performed in the first layer.

Preferentially, the number of stairsteps on the profile is equal to $2^n$, where n is the number of etching steps previously performed in order to form the trenches in the first layer.

Preferably, the method comprises several steps of etching trenches, and in which, during each etching step, a depth P is etched such that $P=p.2^n$ where n is the number of etching steps previously performed in order to form trenches and p is the depth etched during the first etching.

The method comprises a plurality of sequences of steps, the steps of etching the trenches forming a plurality of walls situated under the buffer patterns.

Advantageously, the at least one etching step for forming trenches is an anisotropic etching. The principal direction of the anisotropic etching is substantially perpendicular to the plane of the first layer.

The method comprises, after the at least one sequence, a step of removing the masking patterns, and then a step of removing the buffer patterns.

The method preferably comprises: a step of removing the masking patterns, a step of removing the buffer patterns revealing the walls previously covered by the buffer patterns, and then an etching step in order to remove the walls.

Advantageously, the etching step for removing the walls is an isotropic etching. According to one embodiment, the isotropic etching is a dry etching by delocalised plasma. According to another embodiment, the isotropic etching may be obtained by a machine for deep etching of the silicon functioning in isotropic mode. The isotropic etching of the silicon may also be obtained, without plasma, using $XeF_2$ gas. It is also possible to perform the etching of the walls with any liquid enabling isotropic etching on a layer of semiconductor or non-semiconductor material.

Advantageously, the thickness etched during the etching in order to remove the walls is greater than or equal to half the thickness of the widest wall. Particularly advantageously, the thickness etched during the etching for removing the walls is approximately equal to twice the thickness of the widest wall. This makes it possible to reduce the roughness of the inclined wall approximated by the stairsteps.

Particularly advantageously, the width of the buffer patterns is greater than or equal to the tolerance gap in alignment of the equipment for forming the masking patterns. Typically, the alignment tolerances of the equipment for forming the masking patterns are between −80 nm and +80 nm and the width of the patterns is at least 160 nm.

Preferentially, the buffer patterns have the same width.

Preferentially, the trenches have the same width. Advantageously, the slope of the inclined general profile approximated by a staircase is constant. According to an alternative, the trenches have different widths and the slope of the inclined general profile approximated by a staircase is variable.

According to a first embodiment, the first layer is a layer of semiconductor material. According to another embodiment, the first layer is a layer of material that is at least partially reflective or mainly reflective, such as a metal. In this case, preferably, the device will function mainly in diffraction. According to another embodiment, the first layer is a layer of material that is at least partially reflective or mainly reflective such as glass or quartz for example. In this case, preferably, the device will function mainly in refraction.

Advantageously, the first layer forms a substrate. In general terms, the first layer may be formed from any material that can be etched anisotropically and isotropically.

Advantageously, the semiconductor material is silicon. Such a substrate has in particular the advantage of being compatible with MEMS (micro-electro-mechanical system) devices or MEOMS (micro-opto-electro-mechanical system) devices developed otherwise. Thus, the substrate or layer in which the inclined profile is produced is intended for producing MEMSs or MOEMSs.

Advantageously, the buffer patterns are made from silicon oxide. This material has the advantage of being able to withstand the etching of the first silicon layer and to be able to be removed without damaging the latter. Advantageously, the silicon oxide buffer patterns are obtained from a layer of silicon oxide. The thickness of the buffer layer and therefore that of the buffer patterns is between 100 nm and 2 micrometres. Preferably it is around a few hundreds of nanometres and more precisely between 200 nm and 500 nm. It can be obtained by thermal oxidation of the silicon or by deposition.

Preferentially, the buffer patterns are made from aluminium. This material has the advantage of being able to withstand the etching of the first quartz layer and be able to be removed without damaging the latter.

Advantageously, the masking patterns are produced by photolithography from a buffer layer covering the first layer. For example, a resist mask can be deposited on the buffer layer, and then patterns can be formed in the layer of resist before etching the buffer layer through the resist mask.

Advantageously, the method comprises, after the step of etching the walls, a step of metallisation of the stairsteps. This has the advantage of improving reflectivity compared with that of a substrate of the silicon type. The efficacy of a device functioning by diffraction can thus be improved. The metal deposition may for example be performed with known techniques of vacuum evaporation, cathodic sputtering or CVD or PECVD deposition.

Advantageously, several staircase profiles are produced in the same first layer. It is thus possible to obtain a "sawtooth" or "herringbone" structure.

According to another aspect, the invention relates to a system comprising at least one refractive or diffractive optical device obtained by a method according to any one of the previous features.

According to yet another aspect, the invention relates to a method for producing, in a first layer, at least one inclined general profile approximated by a staircase profile having a plurality of stairsteps; the production of the profile comprising the following steps: a step of forming buffer patterns on the first layer so as to define on the first layer a buffer mask and at least one sequence of steps comprising:
- a step of forming masking patterns, performed so that each masking pattern has at least one edge situated above a buffer pattern and covers at least one area of the first layer not masked by the buffer patterns and performed so as to define, for the first layer, a plurality of free areas not masked by the masking patterns or by the buffer patterns;
- a step of etching the free areas in order to form trenches.

Optionally and advantageously, the other steps and features detailed with reference to the method for producing a refractive or diffractive optical device are perfectly applicable to the method for producing an inclined profile approximated by a staircase profile.

BRIEF DESCRIPTION OF THE FIGURES

Other features, aims and advantages of the present invention will emerge from a reading of the following detailed description with regard to the accompanying drawings, given by way of non-limitative examples and on which:

FIGS. 4b-5b illustrate steps of the production method according to the known art and in which a defect in alignment towards the right occurs;

FIGS. 4c-5c illustrate steps of the production method according to the known art and in which a defect in alignment towards the left occurs;

FIG. 6 illustrates a stack of layers comprising a buffer layer covering a first layer in which it is wished to produce an inclined profile approximated by a staircase profile.

FIG. 7 illustrates a step at the end of which the buffer layer is partially etched so as to form buffer patterns;

FIG. 8 illustrates a step of forming first masking patterns;

FIG. 9 illustrates a step where the first layer is etched through the masking patterns and the buffer patterns in order to form trenches;

FIG. 10 illustrates a second step of forming masking patterns;

FIG. 11 illustrates another step where the first layer is etched through the masking patterns newly formed and the buffer patterns in order to form or deepen the trenches;

FIG. 12 illustrates a third step of forming masking patterns;

FIG. 13 illustrates another step where the first layer is etched through the masking patterns newly formed and the buffer patterns in order to form or deepen the trenches;

FIG. 14 illustrates a step of removing the masking pattern;

FIG. 15 illustrates a step of removing the buffer patterns;

FIG. 16 illustrates the first layer at the end of step 15 and illustrates the profile that will be obtained at the end of step 17;

FIG. 17 illustrates a step of etching the walls remaining between the trenches and previously covered by the buffer patterns.

DETAILED DESCRIPTION OF THE INVENTION

Figure 1:
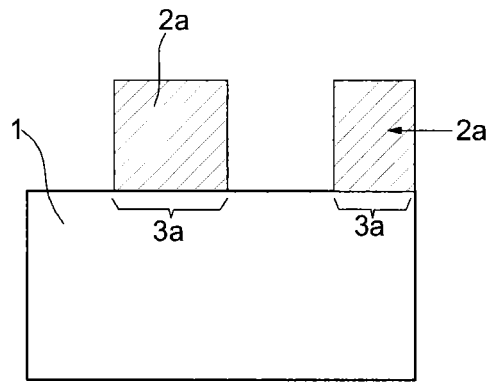
FIGS. 1-3, 4a and 5a illustrate the main steps of a method for producing trenches according to a known technique.
Figure 2:
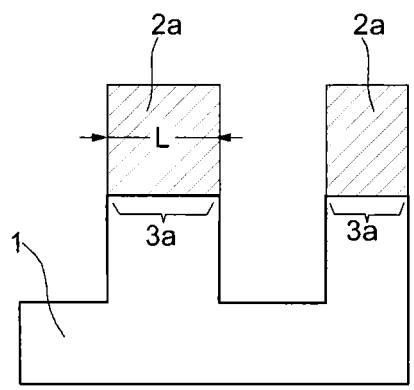
Figure 3:
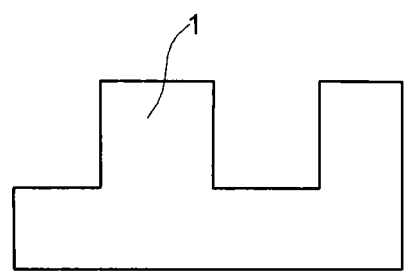
Figure 4A:
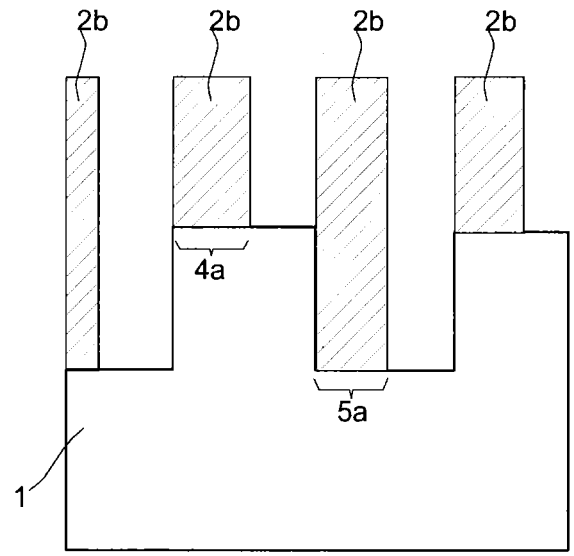
Figure 5A:
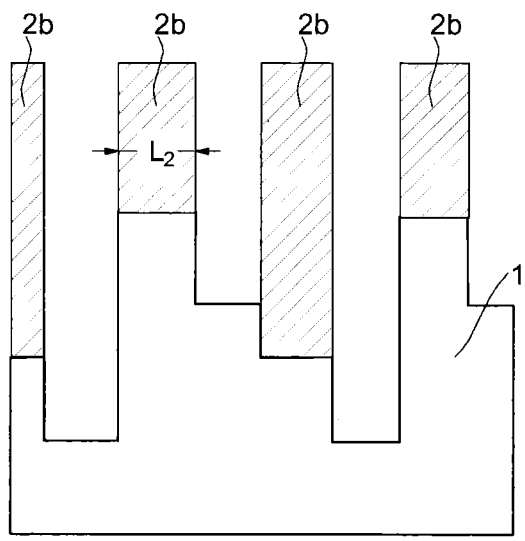
Figure 4B:
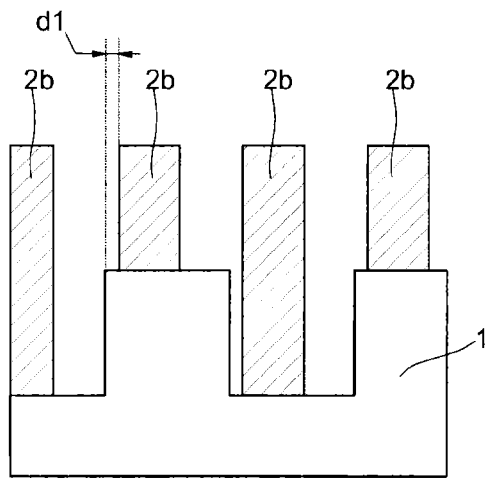
Figure 4C:
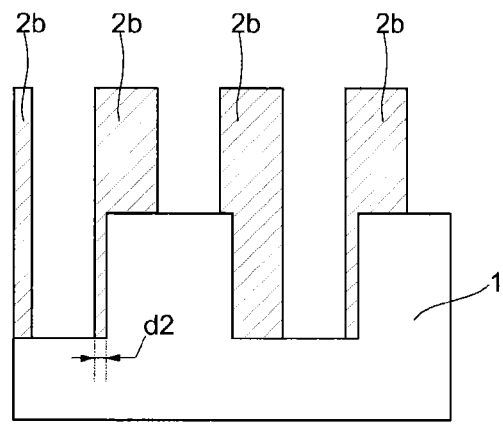
Figure 5B:
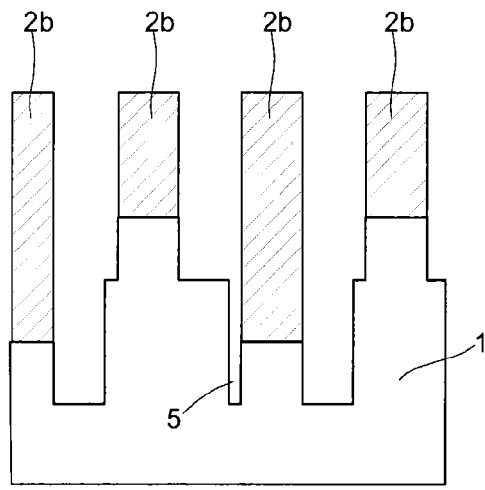
Figure 5C:
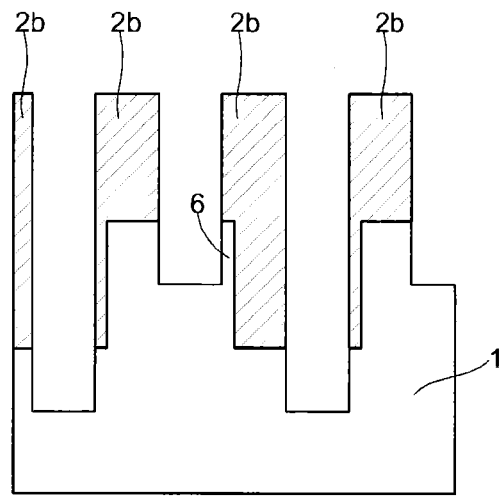

The production of an inclined profile to form preferably an optical device will now be detailed with reference to FIGS. 6 to 17.

First it is specified that, in the context of the present invention, the term "on" does not necessarily mean "in contact with". Thus, for example, the deposition of one layer on another layer does not necessarily mean that the two layers are directly in contact with each other but means that one of the layers at least partially covers the other while being either directly in contact with it or being separated from it by film, or another layer or another element.

In the context of the present invention, the term inclined profile means that the slope of the profile is inclined with respect to the plane defined by the first layer. In the figures, this plane is transverse to the drawing and is parallel to the plane XY defined by the orthonormal reference frame XYZ in FIG. 6. The inclination is typically between 0° and 90°.

Figure 16:
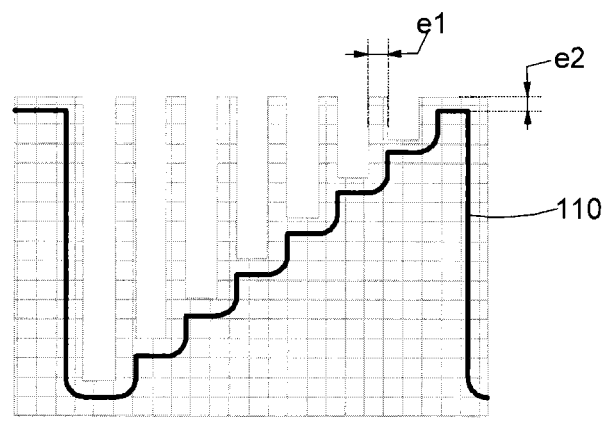
Figure 17:
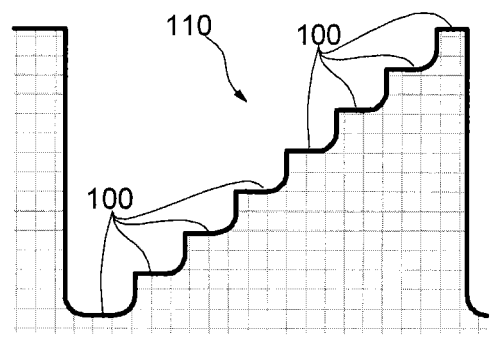

As indicated previously, the purpose of the following method is to produce a staircase profile 110 that approximates to an inclined general profile. The staircase comprises a plurality of stairsteps 100. The profile 110 is illustrated in FIGS. 16 and 17. The inclined profile 110 and at least the stairsteps 100 preferably have a micrometric/nanometric scale.

Figure 6:
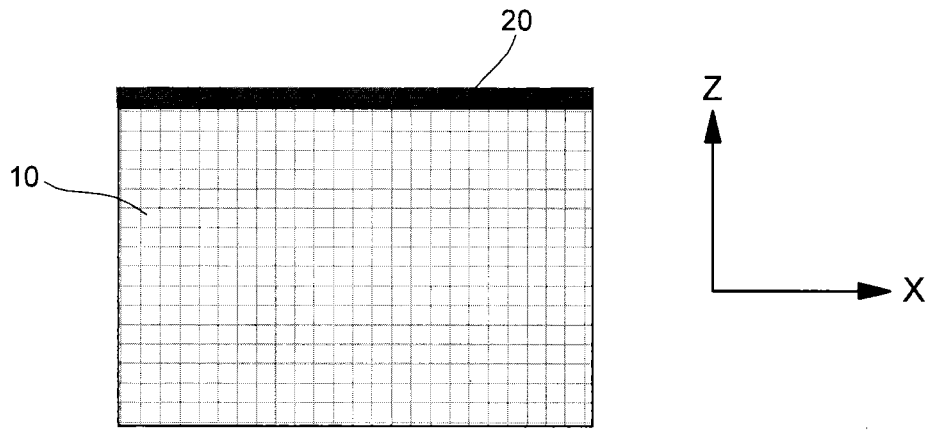
FIGS. 6 to 17 illustrate steps of a method according to an example embodiment of the invention making it possible to obtain an inclined profile approximated by a staircase profile as depicted in FIG. 17. More precisely.

In a first step, illustrated in FIG. 6, a buffer layer 20 is deposited on a first layer 10 in which it is wished to form the stairsteps of the staircase. The first layer 10 is produced from a material that may be etched isotropically and anisotropically. Advantageously, the first layer 10 serves as a substrate.

Figure 7:
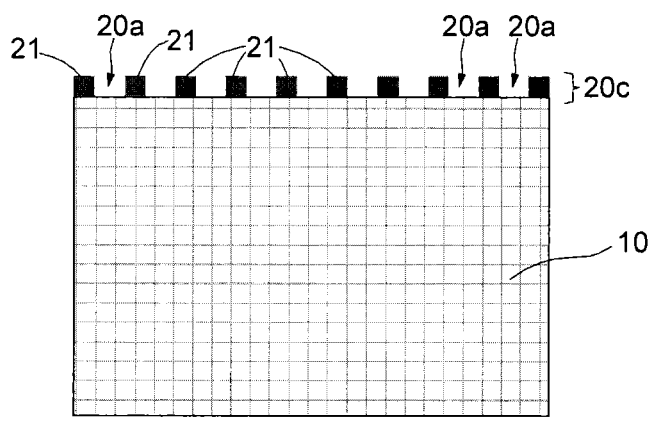

As illustrated in FIG. 7, patterns are formed in the buffer layer 20 so as to form a buffer mask 20*c*. These patterns are hereinafter designated buffer patterns 21. Thus the buffer mask 20*c* defines for the first layer 10 areas masked by the buffer patterns 21 and free areas 20*a* not masked by the buffer patterns 21. Advantageously, the buffer patterns 21 are disposed so as to define an alternation of areas masked by the buffer patterns 21 and free areas 20*a* not masked by the buffer patterns 21.

The buffer patterns 21 can be obtained by conventional lithography steps. It is in particular possible to make provision for covering the buffer layer 20 with resist and then perform patterns in the resist layer by nanometric printing using a mould comprising reliefs or by insolation of a selection of areas of the resist if it is a case of a photosensitive resist. After any development of the resist, the buffer layer 20 is etched through the resist patterns and the latter are then removed. The step of etching or selective etching of the buffer layer 20 is an anisotropic etching. It is advantageously performed by plasma dry etching.

Figure 8:
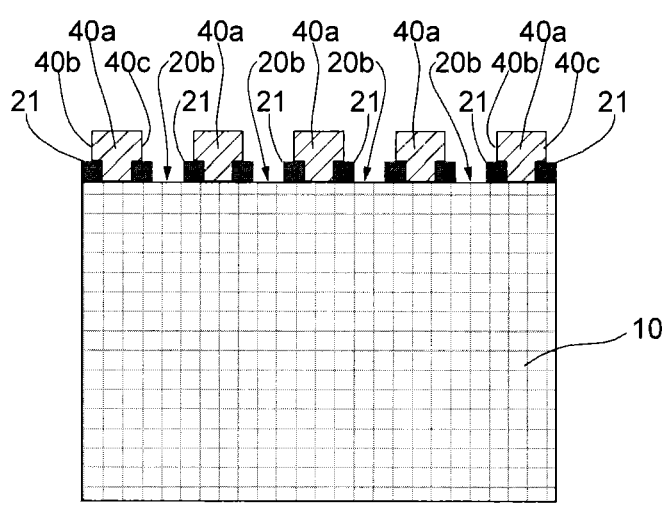

As illustrated in FIG. 8, a mask is produced in a second layer. This mask has patterns referred to as masking patterns 40*a*.

Advantageously, these masking patterns 40*a* are produced from a layer referred to as a masking layer, which was applied to the buffer mask 20*c*. The masking patterns 40*a* are preferably made from resist. They may thus be produced by a conventional lithography method by nanometric printing or by photolithography, such as those mentioned previously for producing the buffer patterns 21.

The masking patterns 40*a* are effected so as to cover certain free areas 20*a* not masked by the buffer patterns 21 and so as not to cover certain other free areas 20*a* not masked by the buffer patterns 21. Thus some areas 20*b* of the first layer 10 are covered neither by the buffer patterns 21 nor by the masking patterns 40*a*. These areas 20*b* appear in FIG. 8.

Observing the stack of layers in cross-section, along a plane that comprises the axes X and Z, the areas 20*a* not covered by the buffer patterns 21 are, in alternation, covered and not covered by the masking patterns 40*a*. Thus, except at the ends of the stack of layers, an area 20*b* neither covered by a buffer pattern 21 nor covered by a masking pattern 40*a* is adjacent to two areas covered by a buffer pattern 21.

Particularly advantageously, the masking patterns 40*a* have at least one edge (40*b* or 40*c*) that covers a buffer pattern 21.

An edge is formed by a wall of a pattern that extends in a direction substantially perpendicular to the surface of the first layer 10, that is to say in a direction substantially parallel to the axis Z of the reference frame in FIG. 6. When the pattern is a line, its edge forms, along a plane substantially parallel to that of the first layer 10, also a line. When the pattern is a ring, the edge forms, in a plane substantially parallel to that of the first layer, a circle with the same centre as the ring. In the figures illustrated, the edges appear in accordance with a cross-section substantially transverse to the direction in which the pattern extends. Thus, in these figures, the patterns and trenches may be lines, a succession of segments, aligned or not, circles, etc. The invention is not limitative of the shapes defined by the patterns in a plane parallel to that of the first layer (plane XY).

The masking pattern 40*a* covers at least part of the buffer pattern 21 as well as an area of the first layer 10 not covered by the buffer pattern 21. Thus, whatever the position of the edge (40*b* or 40*c*) of the masking pattern 40*a* on the buffer pattern 21 as long as this edge is situated above the buffer pattern 21, then this edge (40*b* or 40*c*) will have no influence during an etching performed in order to form trenches in the first layer 10. This edge will not delimit any of the walls of the trenches.

The constraints in positioning of the masking pattern 40*a* can thus be relaxed.

It should be noted that it is preferable for the masking patterns 40*a* to have both edges 40, 40*c* covering a buffer pattern 21. This is illustrated in FIG. 8. Each of the two vertical edges 40*b*, 40*c* in the plane ZX is situated above a buffer pattern 21. Each masking pattern 40*a*, except possibly those at the ends of the stack of layers, therefore successively overlap from one of their edges 40*b*: a buffer pattern 21, an area not masked by a buffer pattern 21 and another buffer pattern 21. As will be seen below during other steps, the same masking pattern 40*a*, 50*a* or 60*a* may cover more than two buffer patterns 21 and several areas 20*b* of the first layer 10 not covered by a buffer pattern 21.

It is therefore the buffer patterns 20 that delimit the walls of the trenches that can be produced by etching in the first layer 10. The masking patterns 40*a* have no influence on these walls. A defect in alignment of one or more masking patterns 40*a*, as long as the edges (40*b*, 40*c*) of this masking pattern 40*a* are disclosed in line with a buffer pattern 21, will have no influence on the positioning of the walls of the trenches. Such a defect in alignment will therefore not reveal any hollow or peak. The invention thus reduces the alignment constraints and considerably limits the risks of appearance of hollows or peaks.

Particularly advantageously, the width of the buffer patterns 21 is greater than or equal to the tolerances in alignment of the lithography equipment used to produce the masking patterns. In the context of the present invention, it is possible to use conventional lithography equipment, for example equipment of the ASM/300 type. The tolerance in alignment of conventional lithography equipment is around +/−75 nm (nanometres) approximately, that is to say a tolerance amplitude of 150 nm. Buffer patterns 21 with a width of at least 150 nm will then be produced. The width of a pattern is its dimension taken in a direction substantially parallel to the surface of the first layer 10, that is to say in a direction substantially parallel to the axis X of the reference frame in FIG. 6.

At the end of the first lithography step for producing masking patterns 40*a*, the first layer 10, observed in cross-section along the plane ZX and in the direction of the axis X, comprises several successions of areas, each succession comprising successively:

an area masked by a buffer pattern 21,
an area masked by a masking pattern 40a,
an area masked by a buffer pattern 21,
a non-masked area 20b.

Preferably, all the above four areas are repeated for the entire length of the first layer 10 along the direction X, except possibly at the ends.

Figure 9:
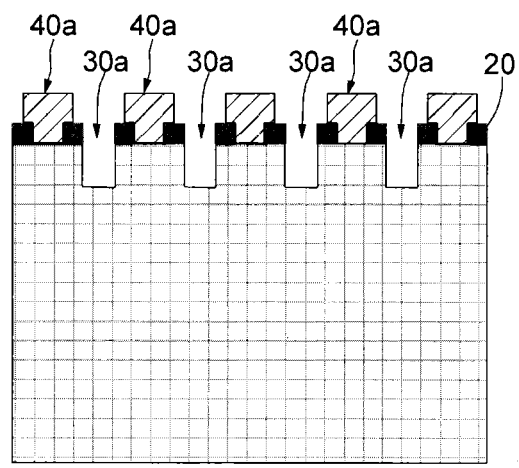

At the end of the first lithography step, a first step of etching the first layer 10 is performed. The result of this step is illustrated in FIG. 9. The combination of the buffer patterns 21 and the masking patterns 40a forms an etching mask for etching the first layer 10 at the areas of this layer that are not covered by any pattern. The etching thus forms trenches. The etched depth p during this first step is typically between 200 nm and 1 μm. It is preferentially around 400 nm. The depth is measured in the direction Z. This etching is anisotropic with its principal direction along the axis Z.

A step of removing the masking patterns 40a is preferably performed. The buffer patterns 21 are for their part kept. A method of selective removal of the masking patterns 40a is therefore applied. This selective removal is particularly simple when the masking patterns 40a are made from resist and the buffer patterns 21 are made from silicon oxide, silicon nitride or metal.

Figure 10:
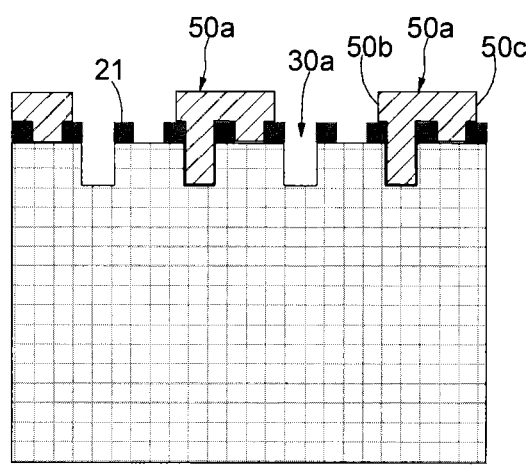

As illustrated in FIG. 10, a second step of forming masking patterns 40a is performed. These new masking patterns 40a are preferably produced by lithography.

These new masking patterns 50a are formed so that at least one of their edges 50b, 50c is situated in line with a buffer pattern 21. For the reasons mentioned previously, it is preferable for the two edges 50b, 50c each to be situated vertically in line with a buffer pattern 21.

These new masking patterns 50a are also disposed so as:
to cover: areas not etched and trenches formed at the previous etching step, and
not to cover: areas not etched and trenches formed at the previous etching step.

At the end of this second lithography step for producing new masking patterns 50a, the first layer 10, observed in cross-section along the plane ZX and in the direction of the axis X, comprises a plurality of successions of areas, each succession comprising successively:
an area masked by a buffer pattern 21,
a trench masked by a masking pattern 50a and having been etched, this trench preferably having a depth p,
an area masked by a buffer pattern 21,
a trench masked by a masking pattern 50a and having been etched, this trench preferably having a depth p,
an area masked by a buffer pattern 21,
an area not masked and having been etched, this trench preferably having a depth p,
an area masked by a buffer pattern 21,
an unmasked area that has not been etched.

This succession of eight areas is repeated for the entire length of the first layer 10 along the direction X, except at the ends.

Preferably, a single masking pattern 50a is formed for a succession of areas as defined previously.

Figure 11:
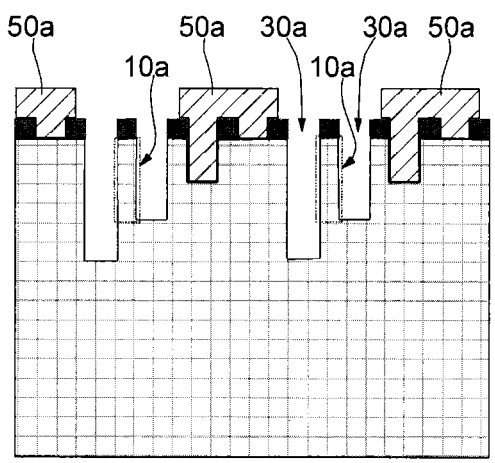

As illustrated in FIG. 11, a second etching of the first layer 10 is carried out through the mask formed from the combination of buffer patterns 21 and masking patterns 50a formed last.

The etching also makes it possible to form trenches where there had not been trenches previously and makes it possible to increase the depth of the trenches formed previously. The depth etched during this etching is advantageously around 2 p, that is to say it is twice the depth etched during the previous etching step (illustrated in FIG. 9). The first layer 10 thus has non-etched areas, trenches etched only once the depth of which is p, trenches etched only once the depth of which is 2 p and trenches etched twice the depth of which is 3 p (p+2 p).

Thus, at the end of this second step of etching the first layer 10, the latter has, along the direction X, a repetition of three consecutive trenches, the depth of which gradually decreases. Two of these trenches have been etched during this second etching step and one has not been etched during the step since it is protected by a resist masking pattern 50a. The latter trench is adjacent to a non-etched area.

Three trenches and one area are therefore successively obtained, not etched and each separated by a wall formed by the first layer. This succession is repeated along the axis X.

A step of removing the masking patterns 50a last formed is preferably performed. The buffer patterns 21 are for their part kept.

Figure 12:
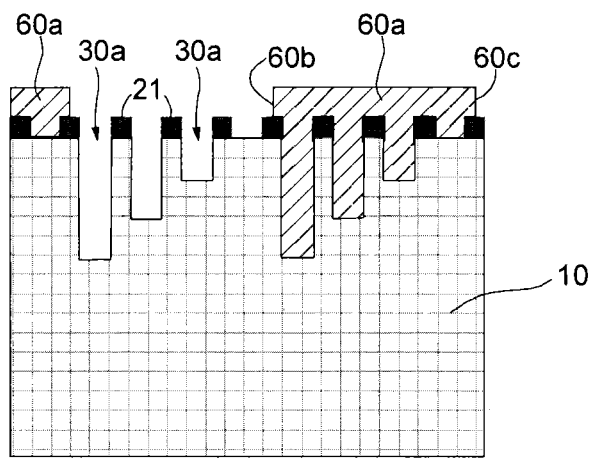

As illustrated in FIG. 12, a new step of forming masking patterns 60a is performed. Preferably, these new masking patterns 60a are produced by lithography.

These new masking patterns 60a are formed so that at least one of their edges 60b, 60c is situated in line with a buffer pattern 21. For the reasons mentioned previously, it is preferable for the two edges 60b, 60c each to be situated vertically in line with a buffer pattern 21.

These new masking patterns 60a are also disposed so as:
to cover: areas not etched and trenches formed at the previous etching step, and
not to cover: areas not etched and trenches formed at the previous etching step.

At the end of this new lithography step for producing new masking patterns 60a, the first layer 10, observed in cross-section along the plane ZX, comprises several successions of areas. Each succession comprises a masking pattern 60a, covering successively along the axis X:
an area masked by a buffer pattern 21,
a trench masked by a masking pattern 60a and that has been subjected to two etching steps, this trench preferably having a depth of 3 p,
an area masked by a buffer pattern 21,
a trench masked by a masking pattern 60a and that has been subjected to one etching step, this trench preferably having a depth of 2 p,
an area masked by a buffer pattern 21,
a trench masked by a masking pattern 60a and that has been subjected to one etching step, this trench preferably having a depth of p,
an area masked by a buffer pattern 21,
a trench masked by a masking pattern 60a and that has not been etched,
an area masked by a buffer pattern 21.

In addition, the succession of areas comprises, between two consecutive masking patterns 60a, four areas not masked by any pattern, these four non-masked areas being separated by three buffer patterns 21. These four non-masked areas being respectively:
a trench preferably having a depth of 3 p,
a trench preferably having a depth of 2 p,
a trench preferably having a depth of p,
an area that has not been etched.

Figure 13:
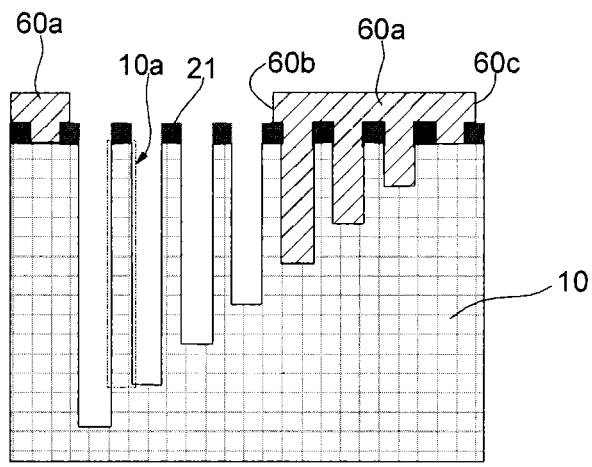

As illustrated in FIG. 13, a third step of etching the first layer 10 through the mask formed by the combination of buffer patterns 20 and masking pattern 60a last formed is performed.

The etching thus forms trenches where there previously had not been trenches and increases the depth of the trenches previously formed. The depth etched during this etching is advantageously around 4 p, that is to say it is twice the depth etched during the previous etching step (illustrated in FIG. 11) and is four times greater than the depth etched during the first etching step (illustrated in FIG. 9). The first layer 10 thus has non-etched areas, trenches etched only once the depth of which is p, trenches etched only once the depth of which is 2 p, trenches etched twice the depth of which is 3 p, trenches etched only once the depth of which is 4 p, trenches etched twice the depth of which is 5 p, trenches etched twice the depth of which is 6 p and trenches etched three times the depth of which is 7 p.

Thus, at the end of this third step of etching the first layer 10, the latter has, along the direction X, a repetition of: seven consecutive trenches the depth of which decreases gradually and a non-etched area. These seven trenches and this non-etched area are each separated by a wall formed in the first layer. This succession is repeated along the axis X.

Figure 14:
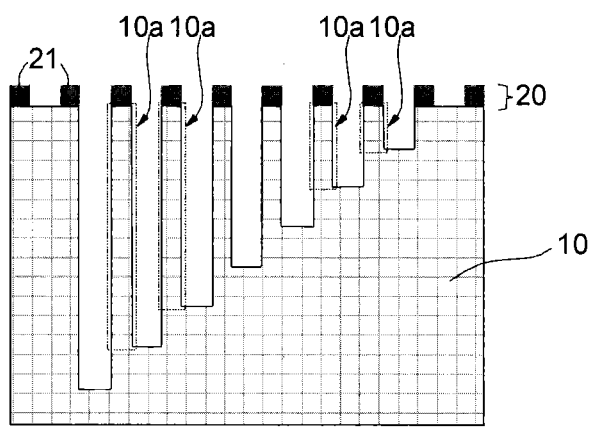

As illustrated in FIG. 14, a step of removing the masking patterns 60a last formed is preferably performed. The buffer patterns 21 are for their part kept.

Figure 15:
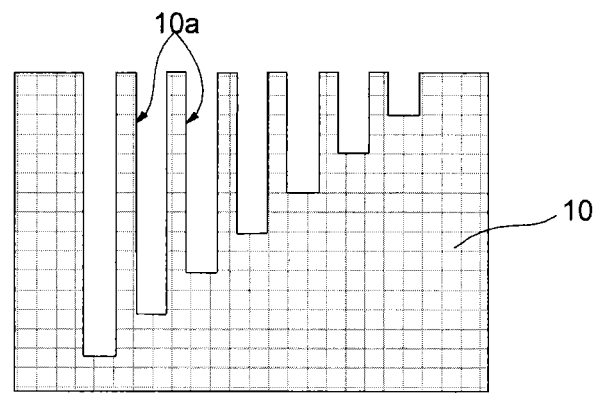

At the end of the last step of etching the first layer 10 in order to form trenches, the buffer patterns 21 are eliminated as illustrated in FIG. 15.

A structure is then obtained having trenches of increasing or decreasing depth and separated from one another by walls 10a. These walls correspond to the areas of the first layer covered by the buffer patterns 21. The previous etchings being anisotropic, the etchings carried out in the first layer 10 have kept walls substantially vertically in line with the edges of the buffer patterns 21. It is therefore indeed the buffer patterns 21 that delimit the walls of the trenches and the walls 10 separating the trenches.

As illustrated in FIGS. 16 and 17, an etching is carried out of the first layer 10 so as to eliminate the walls 10 separating the trenches. The profile obtained is referenced 110 in these figures.

Preferably, this step of etching the walls 10a is an isotropic etching step. According to one embodiment, the isotropic etching is dry etching by delocalised plasma, also referred to by the term "remote plasma". The equipment used on the platform is for example an industrial machine from the equipment manufacturer Shibaura, consisting of an Allegro mainframe, or base module, supporting a CDE80 chamber. According to other alternatives, the isotropic etching can be obtained by a deep silicon etching machine functioning in isotropic mode. For example, two items of industrial equipment from the company SPTS, designed for deep silicon etching, are used on the platform. The isotropic etching is obtained by operating only the source generator of the chamber. The isotropic etching of the silicon can also be obtained, without plasma, using $XeF_2$ gas. In this case, for example Xactix laboratory equipment can for example be installed on the platform. It is also possible to effect the etching of the walls 10a with any liquid enabling isotropic etching on a layer of semiconductor or non-semiconductor material.

This step of etching the walls 10 removes a thickness e2 of the material of the first layer 10 at least equal to half the width e1 of the walls 10a, or at least half the thickness e1 of the widest wall if they do not all have the same width.

Advantageously, this etched thickness is doubled, that is to say approximately equal to the width of a wall. In this case, the steps are smoothed and the wall of the slope becomes less rough and more rectilinear.

Continuing the previous example in which the buffer patterns 21 have a width of 150 nm, the walls 10a have substantially a width of 150 nm taken in the direction. The minimum depth to be etched is therefore 75 nm. Advantageously it is 150 nm in order to smooth the roughness of the inclined profile.

In this way stairsteps 100 are obtained, forming a profile 110 in a staircase. With the concatenation of the steps described previously, the stairsteps 100 are 8 in number.

This step of isotropic etching of the walls, associated with the previous steps, considerably reduces the total number of steps. Furthermore, the isotropic etching step attacks the wall laterally, which quickly consumes the thin high walls as well as a small thickness in the bottom of the trenches, thus affording a rapid elimination of the walls and a smoothing of the slope if the etching is continued.

The invention is not limited to the number of stairsteps or to the etching depths or to the patterns described in the previous example. These parameters will be adapted according to the inclined profile that it is wished to produce.

Thus, in general terms, the number of stairsteps 100 of the same profile 110 is equal to $2^n$, where n is the number of etching steps previously performed to form trenches in the first layer. The number of etching steps to be performed according to the number of stairsteps to be produced in order to obtain the desired profile is thus easily determined. Thus, at the end of step 17, three steps of etching the first layer 10 have been performed (see the steps illustrated in FIGS. 9, 11 and 13) and the number of stairsteps is therefore $2^n=8$.

Also in general terms, during a step of forming the masking patterns (40a, 50a or 60a), at least one masking pattern is produced that covers at least one area not masked by a buffer pattern 21, the number of areas not covered by a buffer pattern 21 and consecutive that this same masking pattern covers being equal to $2^n$, where n is the number of etching steps previously performed in the first layer 10. Thus, as illustrated in FIG. 8, the masking patterns 40a cover $2^0=1$ area not masked since no step of etching the first layer has been performed prior to the production of the masking patterns 40a in FIG. 8. As illustrated in FIG. 10, each masking pattern 50a covers $2^1=2$ non-masked areas since a single step of etching the first layer (illustrated in FIG. 9) was performed prior to the production of the masking patterns in FIG. 10. As illustrated in FIG. 12, each masking pattern 60a covers $2^2=4$ non-masked areas since only one step of etching the first layer (illustrated in FIG. 11) was performed prior to the production of the masking patterns 60a in FIG. 12.

Likewise, at each step of forming the masking patterns, two consecutive masking patterns are separated so as to leave between them $2^n$ areas not covered by any buffer pattern 21 or masking pattern. Thus $2^n$ areas not covered by buffer patterns 21 and consecutive are enabled to be etched, n always being the number of etching steps previously performed in the first layer 10.

In general, during each step of etching the first layer 10, a depth P is etched such that $P=p.2^n$ with:
n is the number of etching steps previously performed in the first layer 10 in order to form trenches, and
p is the depth of the first etching.

Thus, the etching illustrated in FIG. 9 is the first etching and the depth thereof is p, This depth satisfies the law $P=p.2^0=p$ since no step of etching the first layer has been performed previously. The etching illustrated in FIG. 11 is the second etching and the depth thereof is $P=p.2^1=2$ p since only one etching has been performed previously in the first layer 10. The etching illustrated in FIG. 13 is the third etching and the depth thereof is $P=p.2^2=4$ p since two etchings have been performed previously in the first layer 10. These two prior etchings correspond to the steps illustrated in FIGS. 9 and 11.

By virtue of the method according to the invention, stairsteps 100 are obtained each having a height of preferentially between 200 nm and 1 μm and typically around 400 nm, the height being taken in the direction Z. The first etching of depth p is therefore preferably between 200 nm and 1 μm. In the example illustrated, the depth of the deepest trench before removal of the walls 10a is 7 p. It is therefore between 7*200 nm and 7*1 μm, that is to say between 1.4 μm and 7 μm. The width of a stairstep 100, that is to say its dimension in the direction X, is preferentially between 200 nm and 1 m. The width of a stairstep 100, that is to say its dimension in the direction X, is preferentially between 200 nm and 1 μm and typically around 500 nm.

On the same layer 10, a plurality of profiles 100 can thus be formed. The highest tread on one of these other profiles appears on the left in FIGS. 16 and 17. It is thus possible to obtain sawtooth or herringbone structures.

As indicated previously, it is necessary for the first layer 10 to be made from a material that can be etched isotropically and anisotropically.

According to one embodiment, the first layer is made from a semiconductor material. Advantageously, the first layer is made from silicon, thus affording compatibility with other devices such as MEMSs or MOEMSs. According to another embodiment, the first layer is a layer of reflective or mainly reflective material such as a metal. In this case, preferably, the device will function mainly in diffraction. According to another embodiment, the first layer is a layer of reflective or essentially reflective material such as glass or quartz for example. In this case, preferably, the device will function mainly in refraction.

The buffer layer 20 can be produced from silicon oxide. The silicon oxide is advantageously obtained by thermal oxidation of silicon or by deposition. The buffer layer 20 has a thickness, measured along the axis Z, typically of a few hundreds of nanometres.

According to a variant, the buffer layer 20 is produced from silicon nitride, if the semiconductor material is silicon. It may also be made from aluminium if the semiconductor material is quartz. These materials withstand the etchings described below and can be removed without damaging the first layer 10.

In order to improve the optical performances thereof, the profile 110 obtained is optionally metallised. This has the advantage of improving reflectivity compared with that of a less reflective substrate. The efficacy of a device functioning mainly by diffraction can thus be improved. The metal deposit may for example be produced by known techniques of vacuum evaporation, cathodic sputtering or CVD or PECVD deposition.

The present invention thus proposes a particularly reliable and simple method for obtaining an inclined profile having a plurality of stairsteps of micrometric/nanometric size while avoiding the formation of hollows or peaks. It advantageously makes it possible to obtain refractive or diffractive optical devices of improved quality. Furthermore, the positioning restraints being reduced, the invention reduces the cost of the equipment necessary and the cost of obtaining the profiles.

The present invention is not limited to the embodiments previously described, but extends to any embodiment in accordance with the spirit thereof. The invention is in particular not limited to stairsteps that extend in a rectilinear direction along the axis X, nor to stairsteps of constant height or thickness, nor to a given number of etching steps or stairsteps.

The invention claimed is:

1. A method for producing, in a first layer, at least one inclined general profile approximated by a staircase profile including a plurality of stairsteps, the method comprising:
   forming buffer patterns on the first layer wherein adjacent buffer patterns are spaced to define a trench width of each trench;
   performing at least one etching sequence comprising:
      forming masking patterns such that each masking pattern includes a first edge situated above a first one of said buffer patterns and a second edge situated above a second one of said buffer patterns, covers at least one area of the first layer not masked by the buffer patterns, and defines, for the first layer, a plurality of free areas not masked by the masking patterns or by the buffer patterns,
      etching the free areas to form trenches having said trench width in the first layer, and
      removing the masking patterns, wherein the etching sequence is performed at least to form initial trenches in the first layer;
   removing the buffer patterns to reveal walls covered by the buffer patterns, and having sidewalls uncovered; and
   then performing an isotropic etching to remove the walls, the isotropic etching laterally etching the walls.

2. A method according to claim 1, wherein, at an end of the etching sequence, the masking patterns are removed and the buffer patterns are left in place.

3. A method according to claim 1, comprising at least two of said etching sequences each comprising forming of masking patterns and etching the free areas to form the trenches.

4. A method according to claim 1, wherein said performing at least one etching sequence includes performing an etching sequence in which at least one masking pattern covers at least one trench previously formed in the first layer.

5. A method according to claim 4, wherein at least one masking pattern covers at least one trench previously formed in the first layer and at least one free area.

6. A method according to claim 4, wherein said at least one masking pattern covers plural trenches previously formed in the first layer, the plural trenches having different depths.

7. A method according to claim 1, wherein a width of the buffer patterns is greater than or equal to a tolerance range of alignment of equipment for forming the masking patterns.

8. A method according to claim 1, wherein, during the forming masking patterns, at least one masking pattern covers at least one area not masked by a buffer pattern, a number of areas not masked by a buffer pattern and covered by a same masking pattern being equal to $2^n$, where n is a number of etching operations previously performed in the first layer.

9. A method according to claim 1, wherein a number of stairsteps on the profile is equal to $2^n$, where n is a number of etching operations previously performed to form trenches in the first layer.

10. A method according to claim 1, comprising plural trench etchings, and wherein, during each etching sequence, a depth P is etched such that $P = p \cdot 2^n$, where n is a number of etching operations previously performed to form trenches and p is depth etched during a first etching.

11. A method according to claim 10, wherein the depth p etched during the first etching is between 200 nm and 1 µm.

12. A method according to claim 10, wherein a thickness etched during the etching to eliminate the walls is approximately equal to or twice a thickness of a widest wall.

13. A method according to claim 1, wherein the at least one etching sequence for forming trenches in the first layer is an anisotropic etching.

14. A method according to claim 13, wherein the isotropic etching is a dry etching by delocalized plasma or a deep reactive ion etching or a chemical etching by an $XeF_2$ gas.

15. A method according to claim 1, wherein the first layer is a layer of semiconductor material.

16. A method according to claim 1, wherein the first layer is a layer of at least mainly reflective material, wherein the inclined profile forms part of production of an optical device functioning essentially in refraction.

17. A method according to claim 1, wherein the first layer is a layer of at least mainly reflective material, wherein the inclined profile forms part of production of an optical device functioning essentially in diffraction.

18. A method according to claim 1, wherein the buffer patterns are made from aluminum.

19. A method according to claim 1, further comprising metallization of the stairsteps.

20. A system comprising at least one refractive or diffractive optical device comprising at least one inclined general profile obtained by a method according to claim 1.

* * * * *